United States Patent [19]
Sonntag

[11] 3,840,398
[45] Oct. 8, 1974

[54] METHOD FOR PRODUCING A SEMICONDUCTOR COMPONENT

[75] Inventor: Aloys Sonntag, Mulheim, Germany

[73] Assignee: LICENTIA Patent-Verwaltungs-G.m.b.H., Frankfurt, Germany

[22] Filed: Dec. 29, 1971

[21] Appl. No.: 213,555

[30] Foreign Application Priority Data
Dec. 29, 1970 Germany ............................ 2064281

[52] U.S. Cl. ............. 117/217, 117/212, 317/234 M
[51] Int. Cl. ............................................... B44d 1/18
[58] Field of Search ......... 117/217, 212; 317/234 M

[56] References Cited

UNITED STATES PATENTS

| | | | |
|---|---|---|---|
| 3,253,951 | 5/1966 | Marinaccio et al. | 317/234 M |
| 3,473,093 | 10/1969 | Bilous et al. | 317/234 M |
| 3,585,075 | 6/1971 | Irvin et al. | 317/234 M |
| 3,711,325 | 1/1973 | Hentzschel | 117/217 |
| 3,715,234 | 2/1973 | Stott | 117/217 |
| 3,717,798 | 2/1973 | Kahn | 317/234 M |

*Primary Examiner*—Cameron K. Weiffenbach
*Attorney, Agent, or Firm*—Spencer & Kaye

[57] ABSTRACT

A method for electrically contacting a silicon body having at least one pn-junction, including adhering a first metal to the body, and adhering a second metal to the first metal and to the body for bridging and completely covering the edge of the interface between the first metal and the body, the oxygen compound of the second metal being stable and forming a stable compound with the oxygen compound of the body.

10 Claims, 1 Drawing Figure

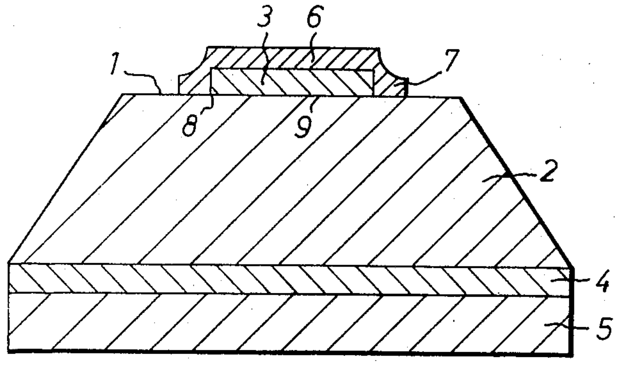
1
3
6
7
8
9
2
4
5

METHOD FOR PRODUCING A SEMICONDUCTOR COMPONENT

BACKGROUND OF THE INVENTION

The present invention relates to a method for producing a semiconductor component of one or more pn-junctions, especially a power diode or a thyristor, using a semiconductor body of silicon and metal contacts for the feeding and withdrawal of electrical current. The component is suitable for extended operation at high temperatures.

Semiconductor components having a semiconductor body of silicon have found wide acceptance, at least partly because of their high reliability even over extended periods of usage.

In such semiconductor components, the contacts for the anode and cathode, and in the case of controllable silicon semiconductor components for the control electrode, are emplaced by deposition from a metal vapor or by a chemical reaction. The contact may be further bonded to the semiconductor body by an alloying process. To this end, layers of aluminum or gold, or gold with small amounts of doping materials such as antimony, or even other metals and doping materials, are brought, together with the semiconductor body, to a temperature between the eutectic temperature and the melting point of the silicon. The silicon beneath the metal layer melts to a depth dependent on the temperature and the thickness of the metal layer and then solidifies as the result of a subsequent cooling on the solid silicon in single crystal form. Simultaneously, a portion of the metal atoms and even doping atoms are incorporated into the silicon lattice.

After the contacting process, the silicon components are subjected to a surface treatment in order to protect them as much as possible from the surrounding atmosphere. Finally, the components are built into hermetically sealed housings which are provided with a protective gas filling.

Semiconductor components with a semiconductor body of silicon built as above described operate, in general, reliably, provided the operational temperature does not exceed 150°C. At temperatures above about 150°C, a multitude of limitations as to reliability and failure of such components are noted. This is at least partly due to loss of the connection between the semiconductor body and the contact metal and the preventing of current transfer between leads and the semiconductor body. Especially in the very common use of gold or a gold/doping-material alloy as the contact metal on a silicon wafer, it has been found that the gold layer peels off of the silicon wafer at operational temperatures above 150°C.

It can be assumed that the loosening of the gold layer from the silicon is due to the formation of an oxide layer on the silicon interface shared with the contact metal. This oxide layer first begins to form at the edge of the interface and then moves under the metal, gradually extending over the entire interface. The gold used as contact material fails to hold on such silicon oxide layers and proceeds to flake off; this leads to an interruption of the contact and to a failure of the semiconductor component.

This oxidation, which can be attributed to the reaction of silicon with oxygen in the air, with moisture, or with substances released from the covering materials, first becomes apparent at operational temperatures in the area of about 150°C. If higher operational temperatures are to be reckoned with, perhaps to 200°C, such as can be the case with high-temperature-resistant power semiconductors, the silicon to metal contact connections are especially endangered.

Processes have been suggested which attempt to prevent the above-described problem by placing the semiconductor component into its housing and evacuating and heating and then cooling in vacuum or in a dry protective atmosphere, before the hermetic sealing of the housing.

These processes do assure operational reliability and the achievement of electrical parameters even over longer operational periods, but they require a considerable expense in processing, because the silicon semiconductor components must be placed in a hermetically sealed housing.

The housing must be evacuated before being sealed and then heated in vacuum at about 300°C for several hours, in order to drive off every last trace of moisture and other volatile substances from the inner walls of the housing or from the components situated in the housing. This process step requires just the same care with which the final filling of the housing with a completely dry, inert gas must be carried out. The filling must be effected in a sealed chamber, with the chamber itself being filled with the dry, inert gas. Over the entire life of the component, the housing must remain hermetically sealed. Thus, only those materials can be used for the housing parts which can resist with certainty a diffusing in of moisture, even over long operational and storage times, in the entire allowable storage temperature range of about −50° to +200°C. For this reason, an application of plastics, which would otherwise be desired, can not be made, because then a diffusion of moisture into the interior of the housing must always be reckoned with.

SUMMARY OF THE INVENTION

An object of the present invention, therefore, is to provide a method for contacting a semiconductor component having one or more pn-junctions, especially a power diode or a thyristor, and having a semiconductor body of silicon and metal contacts for the feeding and withdrawal of an electrical current, which component will operate even at high operational temperatures in the range of about 150° to 200°C reliably and without danger of a loosening of the metal contact from the silicon surface. The method will require less processing expense than methods used heretofore. And the method will also in some cases allow the use of cheaper materials, for example plastics, as housing material.

This as well as other objects which will become apparent in the discussion that follows are achieved, according to the present invention by a method for electrically contacting a silicon body having at least one pn-junction, including adhering a first metal to the body, and adhering a second metal to the first metal and to the body for bridging and completely covering the edge of the interface between the first metal and the body, the oxygen compound of the second metal being stable and forming a stable compound with the oxygen compound of the body.

GENERAL ASPECTS OF THE INVENTION

The objects of the invention are achieved by a method for producing a semiconductor component having one or more pn-junctions, especially a power diode or a thyristor, and including a semiconductor body of silicon and metal contacts for the feeding and withdrawal of electrical current. The method is characterized in that the surface of the metal contact free of the semiconductor body is covered and overlapped on all sides, at least in the edge area of the metal/silicon interface, by another metal whose oxygen compound is stable at the operational temperatures of the semiconductor component and forms a similarly stable compound with the oxygen compound of the semiconductor body.

The result of carrying out the method of the present invention is that the second metal on the first metal contact on the semiconductor surface protects with certainty against a loosening of the first metal from its electrical connection with the body.

It is assumed that when oxygen or an oxygen-releasing compound, for example water, is present, an oxidation of the second metal on the first contacting metal takes place. Also, exposed surface of the semiconductor is oxidized, so that the exposed semiconductor surface and the exposed surface of the second metal are covered by oxide layers or perhaps hydrated oxide layers.

It is further assumed that the oxides of the semiconductor body and the oxides of the appropriately chosen second metal form a chemical compound with one another and that the resulting chemical compound acts as a diffusion barrier to prevent further migration of oxygen or oxygen-containing compounds on the semiconductor body and in particular into the interface between the first metal and the semiconductor body. Thus, oxidation ceases, when the method of the present invention has been applied, after having proceeded only to an insignificant depth. In contrast, in the prior metal contacts of gold or gold compounds without the additional protective metal layer of the present invention, oxygen can react, unhindered, with the silicon, even beneath the metal contact layer, and the metal contact layer lifts off of the formed silicon oxide thereby making possible an ever increasing progression of the oxide layer, or hydrated oxide layer, over the entire semiconductor surface previously connected with the metal contact layer.

Advantageous as compared with prior processes is the simplicity of the present invention. And, a reliable maintaining of electrical contact is assured. The present invention furthermore makes it possible to dispense with a hermetically sealed housing and saves moreover the costly and time consuming heating of the device before sealing. Because of the high temperatures required in the heating, there has always been the danger of damaging the semiconductor body.

BRIEF DESCRIPTION OF THE DRAWINGS

The FIGURE is a partly schematic, elevational, sectional illustration of a semiconductor component contacted by the method of the invention.

DESCRIPTION OF THE PREFERRED EMBODIMENTS

The surface 1 of a semiconductor wafer 2 of silicon containing at least one pn-junction is electrically contracted, for example in the form of a cathode contact, by the adhering of a first metal layer 3 to surface 1. This layer 3 may be put in place by depositing it from vapor or by the laying of a metal foil onto the surface 1. Suited for the material of layer 3 are the noble metals, such as gold, silver, and platinum. The anode contact on the other side of wafer 2 is of a conventional layer sequence such as aluminum layer 4 and molybdenum layer 5. The layer thicknesses of the applied contact metals are about 1 to 100 microns.

If, during the application and alloying of the contact metal into the semiconductor body, a desired conductivity type is to be simultaneously produced, the contact metals are applied together with the doping materials, perhaps as an alloy. For example, in order to obtain on silicon a gold contact and a doping of the silicon with antimony, a gold/antimony alloy is used.

In a following process step according to the invention, a second metal layer 6 is adhered onto contact metal 3. Layer 6 may be deposited from a vapor in vacuum, deposited galvanically, or the like. The layer thickness of layer 6 amounts to about 1 to 2 microns, and its diameter is about 1 to 2 millimeters, and at least about 0.2 millimeters, greater than the diameter of the first metal layer 3, so that, for instance, as shown at location 7 the layer 3 of contact metal is overlapped on all sides by at least 0.1 millimeters of layer 6 as measured on the horizontal in the FIGURE. As shown in the FIGURE, the portion of layer 6 lying in location 7 is in contact with the vertical edge of layer 3 and with surface 1 of silicon body 2 and bridges and completely covers edge 8 of the interface 9 between first metal layer 3 and silicon body 2. Metal layer 6 must chemically combine with oxygen to form a stable oxygen compound, and the resulting metal oxygen compound must form a chemical compound with the oxygen compound of the silicon. The oxygen compounds must be stable to about 300°C.

It has been found that a layer 6 of chromium is especially effective for the purposes of the invention. A coating of chromium over contact metal 3 acts as a diffusion barrier to prevent an oxidation of the silicon by moisture or oxygen in the air from starting at the edge 8 and progressing into interface 9.

The total layer thickness of the contact metal 3, for example of gold, and the metal coating 6, for example of chromium, on metal 3 must be chosen large enough to eliminate the possibility of pores being present through which oxygen or oxygen compounds could reach interface 9 from the top of coating 6 even though edge 8 might be effectively sealed off. This means that the total layer thickness, i.e., the thickness of the layer 3 plus the thickness of the layer 6, is at least about 3 microns.

The term "stable" as used herein in reference to oxygen compounds is meant to include both chemical and mechanical stability under the temperature conditions under which the semiconductor body is to be operated. Thus, it is apparent from the above teachings that the oxygen compounds must not, for instance, sublimate or decompose upon heating. Furthermore, should the oxygen compounds crack upon growth or spall, this would allow oxygen to move through the resulting gaps to edge 8 and interface 9.

It will be understood that the above description of the present invention is susceptible to various modifications, changes and adaptations, and the same are intended to be comprehended within the meaning and range of equivalents of the appended claims.

I claim:

1. A method for electrically contacting a silicon body having at least one pn-junction, comprising applying a contact layer of a first metal selected from the group consisting of noble metals and alloys thereof to the body, and applying a layer of a second metal, which is different from said first metal and whose oxygen compound resulting from oxidation of the second metal is stable at the intended operating temperatures of the semiconductor body and forms a similarly stable compound with oxygen compound of the body resulting from oxidation thereof, to the first metal and to the body for bridging and completely covering the edge of the interface between the first metal and the body.

2. A method as claimed in claim 1, wherein said second metal is chromium.

3. A method as claimed in claim 2, wherein said step of applying a layer of a second metal provides a second metal layer of a thickness of 0.5 to 2 microns.

4. A method as claimed in claim 3, wherein said step of applying a layer of a second metal provides at least a 0.1 millimeter overlap of said first metal on all sides.

5. A method as claimed in claim 4, wherein the overlap is 1 to 2 millimeters as measured with reference to diameters.

6. A method as claimed in claim 5, wherein said first metal is gold.

7. A method as claimed in claim 5, wherein said first metal is a gold alloy.

8. A method as claimed in claim 5, wherein said first metal is a gold/antimony alloy.

9. A method as claimed in claim 6, wherein said step of applying a contact layer of a first metal provides a first metal layer thickness of 1 to 100 microns.

10. A method as claimed in claim 9, wherein said steps of applying provide a total layer thickness of the first and second metals of at least 3 microns.

* * * * *